United States Patent [19]
Chiang et al.

[11] Patent Number: 5,144,403
[45] Date of Patent: Sep. 1, 1992

[54] BIPOLAR TRANSISTOR WITH TRENCH-ISOLATED EMITTER

[75] Inventors: Shang-yi Chiang, Walnut Creek; Wen-Ling M. Huang, Milpitas; Clifford I. Drowley; Paul V. Voorde, both of Moutain View, all of Calif.

[73] Assignee: Hewlett-Packard Company, Palo Alto, Calif.

[21] Appl. No.: 595,725

[22] Filed: Oct. 9, 1990

Related U.S. Application Data

[63] Continuation of Ser. No. 307,876, Feb. 7, 1989, abandoned.

[51] Int. Cl.⁵ .................. H01L 21/385; H01L 21/425
[52] U.S. Cl. ........................................ 357/49; 357/34; 357/43; 437/31; 437/32; 437/33
[58] Field of Search ................ 357/35, 49, 34, 47; 437/31, 33

[56] References Cited

U.S. PATENT DOCUMENTS

| | | | |
|---|---|---|---|
| 4,252,582 | 2/1981 | Anantha et al. | 437/46 |
| 4,333,227 | 6/1982 | Horng et al. | 29/580 |
| 4,381,953 | 5/1983 | Ho et al. | 148/1.5 |
| 4,392,149 | 7/1983 | Horng et al. | 357/49 |
| 4,483,726 | 11/1984 | Isaac et al. | 437/31 |
| 4,663,831 | 5/1987 | Birrittella et al. | 29/576 E |
| 4,674,173 | 6/1987 | Hahn et al. | 29/576 B |
| 4,693,782 | 9/1987 | Kikuchi et al. | 437/31 |
| 4,705,599 | 11/1987 | Suda et al. | 437/33 |
| 4,706,378 | 11/1987 | Havemann | 437/31 |
| 4,722,908 | 2/1988 | Burton | 437/31 |
| 4,735,912 | 4/1988 | Kawamatsu | 437/33 |
| 4,738,624 | 4/1988 | Iyer et al. | 357/34 |
| 4,745,087 | 5/1988 | Iranmanesh | 437/193 |
| 4,749,661 | 6/1988 | Bower | 437/33 |
| 4,824,799 | 4/1989 | Komatsu | 437/31 |
| 4,847,670 | 7/1989 | Monkowski et al. | 357/34 |
| 4,874,717 | 10/1989 | Neppl et al. | 357/43 |
| 4,879,255 | 11/1989 | Deguchi et al. | 357/43 |

FOREIGN PATENT DOCUMENTS 0339960  11/1989  Japan .................. 357/34

*Primary Examiner*—Andrew J. James
*Assistant Examiner*—Viet Q. Nguyen

[57] ABSTRACT

This invention pertains to a self-aligned, trench-isolated emitter structure and the method for forming same. The emitter structure comprises a portion of a bipolar transistor which exhibits improved function due to the emitter structure. A single layer of conductive material forms both the emitter and base contacts in the transistor structure, which structure has particularly shallow emitter and base junctions (about 0.15 micrometer or less). The self-aligned emitter contact, isolated from the base contact by a dielectric filled trench, permits overall size reduction of the device, whereby junction area and accompanying leakage across junctions is reduced. In addition, when the structure of the bipolar transistor is such that the trench isolates the emitter area from both the base contact and the extrinsic base, it is possible to provide improved base conductivity without generating peripheral transistor effects. The bipolar transistor can be either N-P-N type or P-N-P type depending on the materials of fabrication, although high speed devices are typically of the N-P-N type.

2 Claims, 6 Drawing Sheets

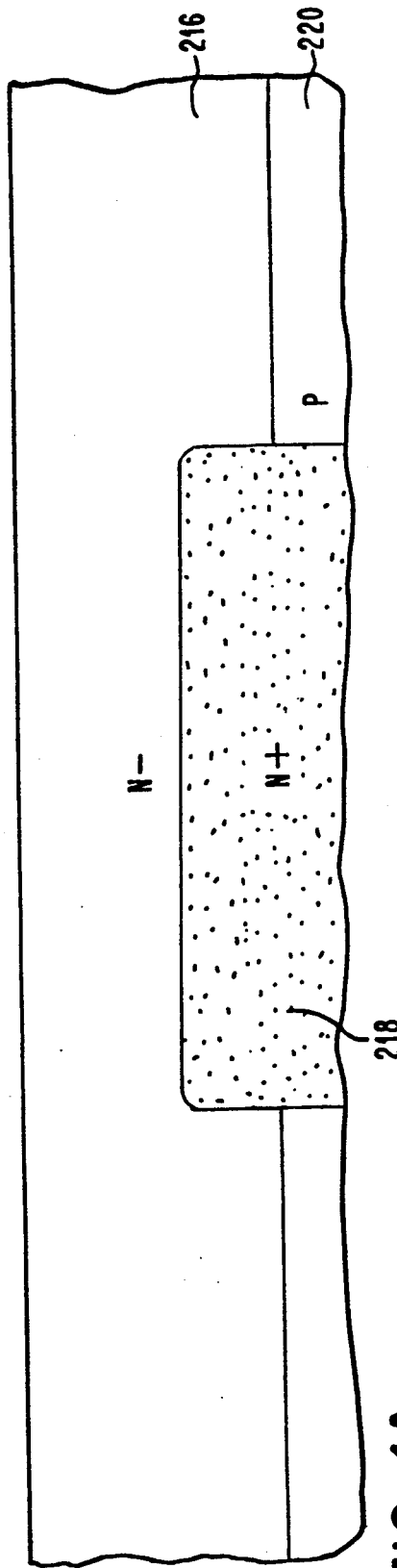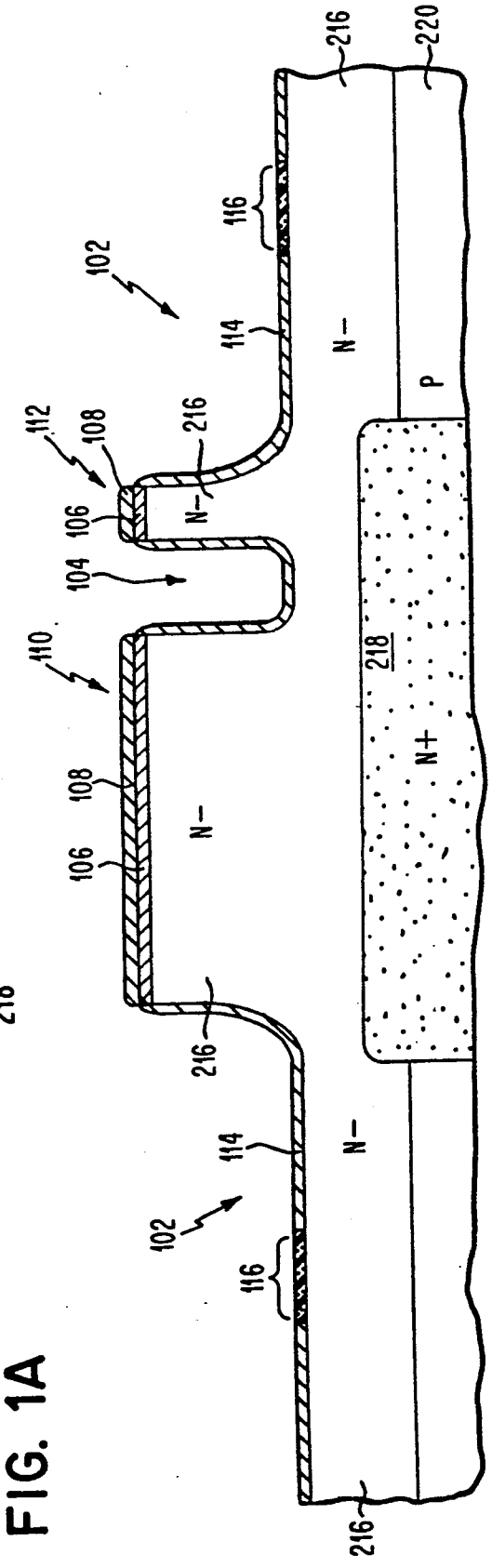
FIG. 1A
FIG. 1B

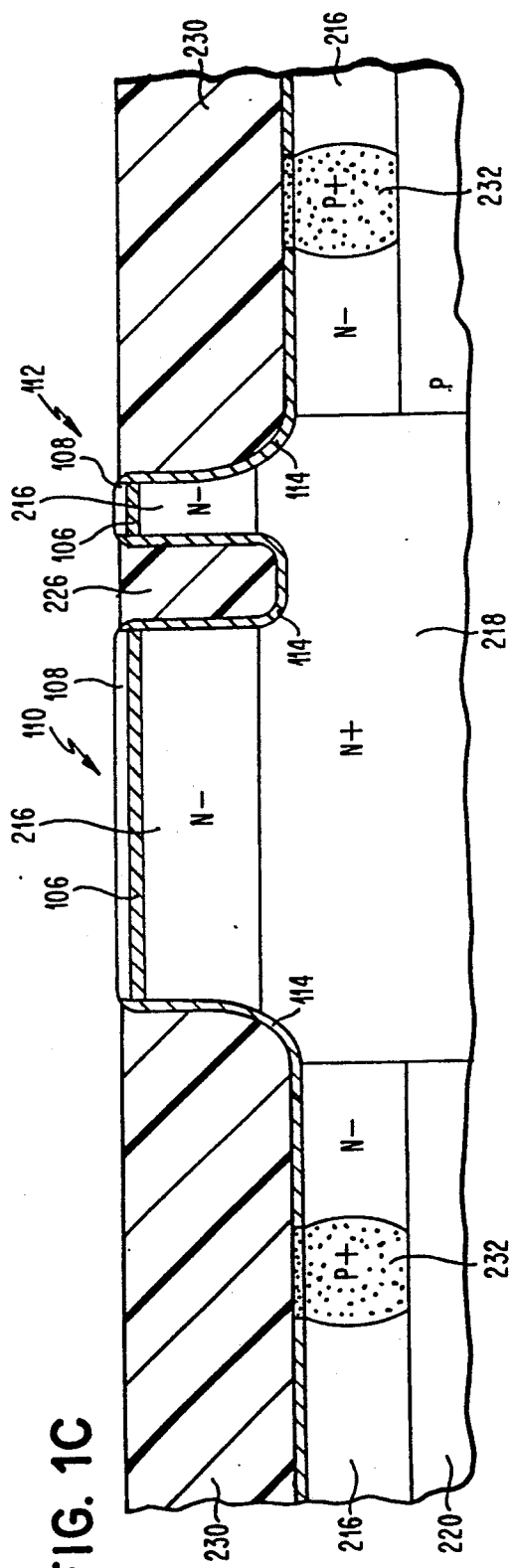
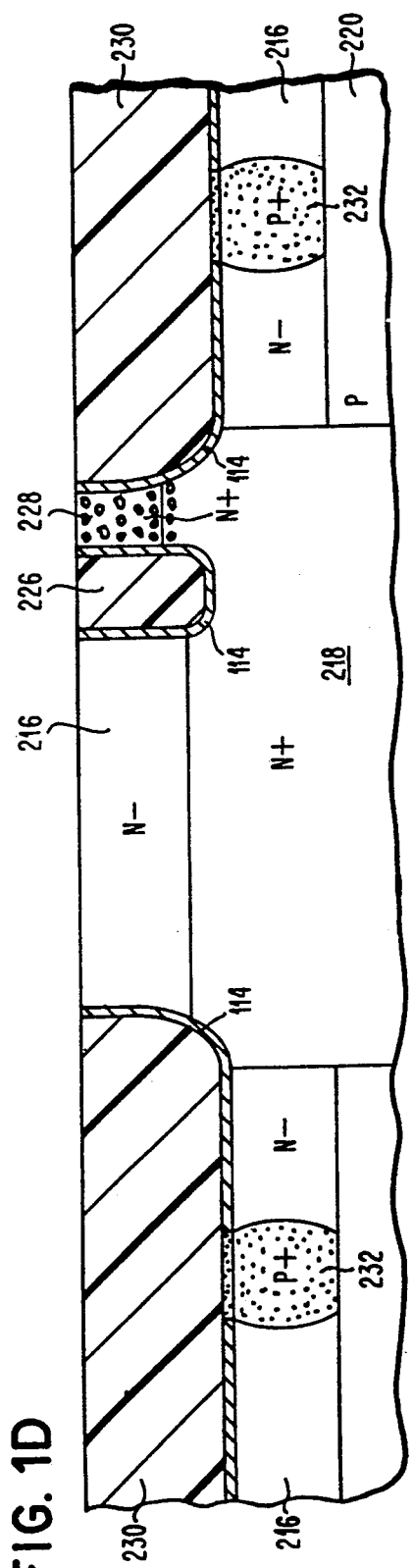
FIG. 1C
FIG. 1D

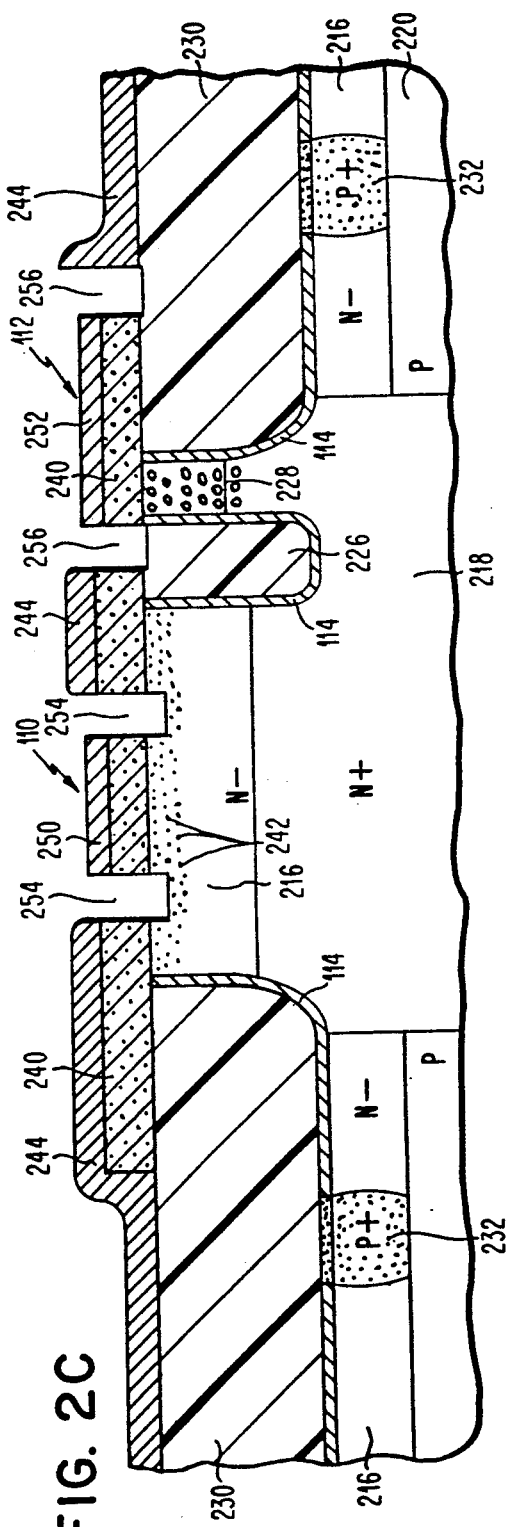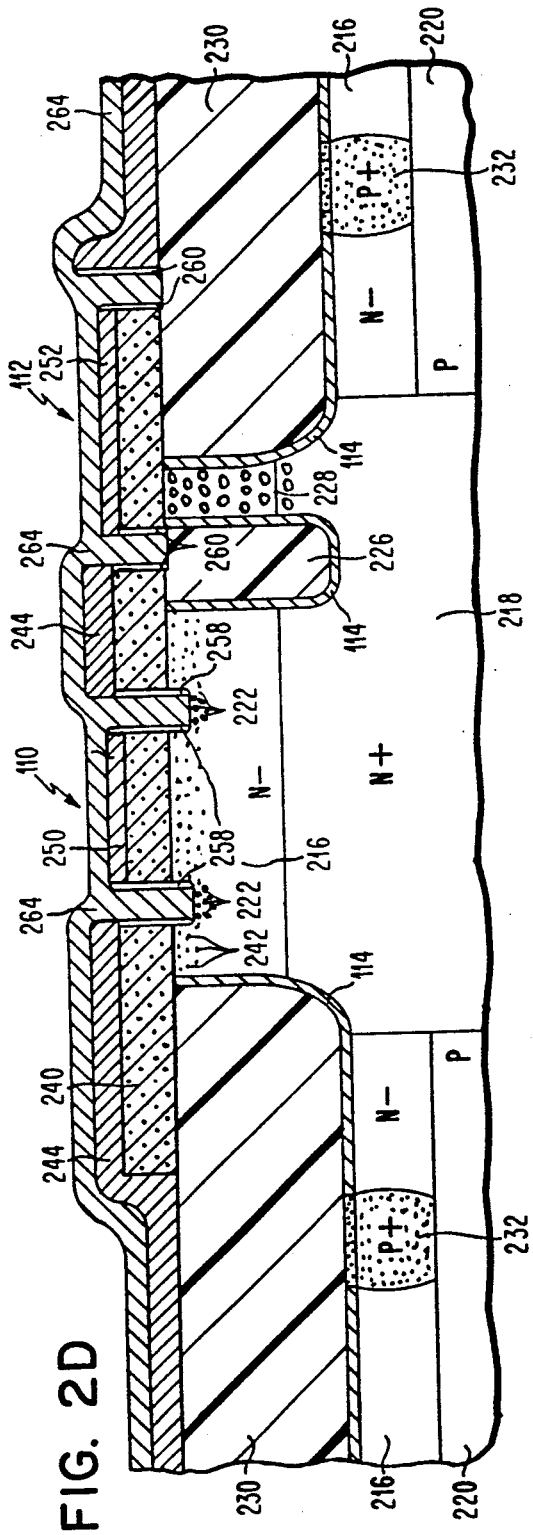

BIPOLAR TRANSISTOR WITH TRENCH-ISOLATED EMITTER

This is a continuation of copending application Ser. No. 07/307,876 filed Feb. 7, 1989, now abandoned.

BACKGROUND OF THE INVENTION

1. Field of the Invention

This invention pertains to a bipolar transistor structure and to a method for forming a portion of the structure comprising a self-aligned, trench-isolated emitter. A single layer of conductive material forms both the emitter and base contacts in the structure, which has particularly shallow emitter and base junctions (about 0.15 micrometer or less). The structure of the self-aligned, trench-isolated emitter permits overall size reduction of the transistor, whereby junction area which leads to parasitic capacitance, and accompanying leakage across junctions are reduced. The emitter structure also enables construction of an intrinsic device (comprising the emitter, an intrinsic base underlaying the emitter and a collector underlaying the intrinsic base) having improved function, since the structure permits improved base conductivity without generating peripheral transistor effects. The bipolar transistor can be either N-P-N type or P-N-P type depending on the materials of fabrication, although high speed devices are typically of the N-P-N type.

2. Background of the Invention

Known bipolar transistor device structures suffer significant limitations in terms of the size of base-collector junction area and collector-substrate junction area, due to the need to provide proper isolation between emitter and base contact regions on the upper surface of the device. In addition, the alignment requirements for the emitter, which are typically limited by photoresist capability also result in increased emitter-base junction area. These larger than desired junction areas can introduce unwanted parasitic capacitance which limits the device or circuit performance.

In addition, known device structures typically exhibit overlap of intrinsic and extrinsic base areas, which results in peripheral transistor effects which create disadvantages in terms of device function.

Examples of bipolar transistor device structures known in the art include the following U.S. Patents.

U.S. Pat. No. 4,722,908 to Burton, dated Feb. 2, 1988, discloses a process for fabrication of a bipolar transistor with a polysilicon ribbon.

U.S. Pat. No. 4,674,173 to Hahn et al., dated Jun. 23, 1987 discloses a method for fabricating a bipolar transistor which uses a polysilicon extrinsic base structure which is formed in a trench having a differential oxidation insulating layer at the bottom of the trench.

U.S. Pat. No. 4,663,831 to Birrittella et al., dated May 12, 1987 describes a method of forming transistors with poly-sidewall contacts using deposition of polycrystalline and insulating layers combined with selective etching and oxidation of said layers.

U.S. Pat. No. 4,392,149 to Horng et al., dated Jul. 5, 1983, describes a self-aligned process for providing a bipolar transistor structure.

U.S. Pat. No. 4,381,953 to Ho et al., dated May 3, 1983, describes a polysilicon-base self-aligned bipolar transistor process.

U.S. Pat. No. 4,333,227 to Horng et al., dated Jun. 8, 1982, describes a method for fabricating a self-aligned micrometer bipolar transistor device.

Although the parasitics problem is recognized in much of the above art, and an effort is made to minimize overall device dimensions, the reduced dimension structures can create peripheral transistor effects which are detrimental to device function, offsetting the advantages obtained by the reduction of parasitics.

SUMMARY OF THE INVENTION

The present invention comprises a self-aligned, trench-isolated emitter structure and the method for forming same. The emitter structure comprises a portion of a bipolar transistor which exhibits improved function due to the emitter structure. A single layer of conductive material forms both the emitter and base contacts of the transistor structure, which structure has particularly shallow emitter and base junctions (typically about 0.15 micrometer or less). The self-aligned emitter contact, isolated from the base contact by a dielectric filled trench, permits overall size reduction of the device, whereby junction area and accompanying leakage across interfacial boundaries are reduced. In addition, when the emitter structure is such that the trench isolates the emitter contact and the emitter from both the base contact and the extrinsic base, improved base conductivity can be provided without generating peripheral transistor effects. The method of fabrication offers the advantages of requiring only one of the difficult and critical depositions of polysilicon. In addition, the method requires no reactive ion etching (RIE) at the interface between the emitter and the emitter contact, and no RIE at the interface between the emitter and the intrinsic base, ensuring the emitter crystalline structure and the intrinsic base crystalline structure will be free of damage of the type which can be caused by RIE. This avoidance of RIE damage at the crystalline structure interfaces reduces the possibility of leakage across the interface between the emitter and intrinsic base.

The bipolar transistor structure can be an N-P-N or a P-N-P type, depending on the materials of fabrication. Although the materials of fabrication disclosed in the detailed description are for an N-P-N type transistor, one skilled in the art, in view of the disclosure herein can easily substitute materials of fabrication, such as dopants, and produce a P-N-P type transistor.

The bipolar transistor structure comprises a planar self-aligned vertical transistor structure of the type shown in FIG. 2F. The N and P lables in FIG. 2F are representative of an N-P-N type transistor, as previously discussed. The self-aligned, trench-isolated emitter structure comprises:

(a) at least one epitaxial layer 216 deposited upon a semiconductor substrate, wherein the substrate includes a region 218 doped to serve as a subcollector, and wherein at least a portion of epitaxial layer 216 is doped to serve as a collector 215 for a bipolar transistor 200;

(b) an intrinsic base 214 overlaying the portion of epitaxial layer 216 serving as collector 215, the intrinsic base 214 being doped to a concentration sufficient to provide the desired base conductivity and interfacial properties when working in cooperation with an emitter;

(c) an emitter 212 overlaying intrinsic base 214, the emitter 212 being doped to provide the desired conductivity and interfacial properties when working in cooperation with intrinsic base 214.

(d) an emitter contact 210 overlaying emitter 212;

(e) an extrinsic base 224 surrounding, but isolated from emitter 212, the extrinsic base 224 being doped to a concentration sufficient to provide the desired base conductivity;

(f) a conductive layer 240 providing at least one base contact 236 overlaying extrinsic base 224; and (g) an isolation trench 234 filled with a dielectric, wherein isolation trench 234 isolates at least emitter contact 210 and emitter 212 from base contact 236 of the transistor device, and wherein preferably isolation trench 234 isolates both emitter contact 210 from base contact 236 and extrinsic base 224 from emitter 212.

Depending on compatibility of materials used, it may be necessary to apply a particularly high conductivity layer over at least emitter contact 210 and base contact 236. This high conductivity layer is not shown in FIG. 2F. Silicides are particularly useful for the high conductivity layer, since they are compatible with the materials used as emitter and base contacts and are also compatible with the metallization connections applied to produce an interconnected semiconductor device. A titanium or platinum silicide can be created over the surface of conductive layer 240 for this purpose.

In a method for fabricating a self-aligned, trench-isolated emitter structure which comprises a portion of a bipolar transistor structure of the kind shown in FIG. 2F, the emitter structure is formed upon a semiconductor substrate region comprising at least one epitaxial layer 216, wherein at least the lower portion of epitaxial layer 216 is doped to serve as a collector 215 for the bipolar transistor 200, wherein the upper portion of epitaxial layer 216 is doped to serve as a base 214 for bipolar transistor 200, and wherein a portion of the substrate region underlaying epitaxial layer 216 comprises a region 218 doped to serve as a subcollector, the method comprises the following steps.

A layer of conductive material 240, generally of a first conductivity type, is formed over the semiconductor substrate region so that conductive material 240 overlays the upper portion of the epitaxial layer 216 which is doped to serve as a base 214 for the transistor.

A sidewall spacer structure 246, as shown in FIG. 2B is formed to extend from above the layer of first conductivity type material 240 to at least the surface of first conductivity type layer 240. Sidewall spacer structure 246 is formed such that it surrounds an intended emitter area positioned within the boundaries of the semiconductor substrate region comprising subcollector 218, collector 215 and base region 214.

An etch-masking layer 250, as shown in FIG. 2B, is created inside sidewall spacer structure 246, and over the surface of the first conductivity type material 240.

After creation of etch-masking layer 250, sidewall spacer structure 246 is removed. Subsequently an isolation trench 254, as shown in FIG. 2C, is etched around etch-masking layer 250, which isolation trench 254 extends from the surface of etch masking layer 250 at least through the layer of first conductivity type material 240. Isolation trench 254 preferably extends from the surface of masking layer 250 through the layer of first conductivity type material 240 and into base region 214. In any case, isolation trench 254 does not extend substantially into the collector portion 215 of epitaxial layer 216. The space surrounded by isolation trench 254 includes the area of the intended emitter when trench 254 extends into the base region 214.

An optional step can be used at this time to introduce a dopant which increases conductivity at the bottom of isolation trench 254, which dopant is compatible with the conductivity type of base 214. The increase in base conductivity at the bottom of trench 254 improves the conductivity path from what will eventually be the transistor base contact, through the transistor extrinsic base to the intrinsic base. This step is optional, since the trench extends only part way through the base region 214 underlaying first conductivity type material 240, so the completely formed transistor device can function adequately without introducing the additional dopant. However, there is always a risk that trench 254 might be overetched to extend all the way through base region 214 to the collector layer 215, and that the base path will not be continuous. By introducing the dopant at the bottom of trench 254 as a link between what will become the extrinsic base and the intrinsic base of the transistor, the continuity of the base conductivity path is ensured.

Isolation trench 254 is then filled with a dielectric material 264. Subsequently dielectric material 264 is etched away from areas other than trench 254, and mask layer 250 is etched away over the area of conductive layer 240 which is surrounded by isolation trench 254, leaving dielectric isolation walls 234 surrounding conductive layer 240, as shown in FIG. 2E.

A dopant capable of creating a material of a second conductivity type is introduced into at least a portion of conductive layer 240 surrounded by dielectric isolation walls 234. The dopant is then diffused into the upper portion of base 214 which underlays conductive layer 240 in the area surrounded by dielectric isolation walls 234, whereby an emitter 212 is created.

In another optional step, a dopant which is capable of increasing conductivity and which is compatible with the base conductivity type can also be introduced into the base region 224 exterior to the isolation wall 234 location; base region 224 comprises the extrinsic base of the transistor device. The dopant is introduced into the portion of first conductive type layer 240 and is transferred through to extrinsic base region 224. Introduction of this additional dopant is not necessary for the transistor to function, but provides improved device performance.

When the bipolar transistor is an N-P-N type, as shown in FIG. 2F, the first conductivity type material is a P material; the collector 215 is comprised of an N− material; the intrinsic base 214 is comprised of a P− material; the second conductivity type emitter 212 is comprised of an N+ material; the emitter contact 210 is comprised of an N+ material; the extrinsic base region 224 can be comprised of a P− material, but is preferred to be of increased conductivity to the level of a P+ material; the base contact 236 is typically comprised of a P+ material.

The method described above begins with a description of a semiconductor structure having a base layer in position overlaying a collector layer. It is possible to apply the layer of first conductive material over the surface of an N− material and to introduce a dopant which creates a P− base layer subsequent to application of the first conductive material. One of the preferred embodiments of the present invention uses this technique for creation of the base layer, and is discussed in the detailed description of the present invention.

When the bipolar transistor is a P-N-P type, the collector 215 is comprised of a P— material; the intrinsic base 214 is comprised of an N— type material; the second conductivity type emitter 212 is comprised of a P+ material; the emitter contact 210 is comprised of a P+ material; the extrinsic base region 224 can be comprised of an N— material, but is preferred to be comprised of a higher conductivity type N+ material; the base contact 236 is typically comprised of an N+ type material.

When necessary to improve compatibility of the integrated circuit conductive connections (typically metallic) with the base and emitter contacts, the contacts can be altered in chemical structure.

Either type of bipolar transistor will have a subcollector, a collector wall, and a collector contact in addition to the transistor elements whose structure and method of fabrication are described above. These additional elements which are present in the complete transistor device are not specifically described above, because their structure and method of formation are generally known in the art and are not considered to be the novel portion of the present invention. However, the structure and method of fabrication of all of the elements which comprise the bipolar transistor are described in the detailed description of the present invention which follows, to enable one skilled in the art to more clearly understand the relationship between the structure and method of fabrication of the entire device.

Subsequent additional method steps are used to provide conductive connections to the bipolar transistor base, emitter, and collector contacts. Typically these connections are metallic and run to other devices which make up an integrated circuit. Depending on the integrated circuit connections design, it may be necessary to apply dielectric layers over portions of the first conductive layer which was used to form the base, emitter, and collector contacts. The dielectric layers isolate the portions of the first conductive layer which are not used to make conductive connections so that crossing integrated circuit connections do not short out the bipolar transistor.

BRIEF DESCRIPTION OF THE DRAWINGS

FIGS. 1A-D are schematics showing cross-sectional views of a bipolar transistor as it progresses through process steps leading up to formation of the self-aligned, trench-isolated emitter structure.

FIGS. 2A-F are schematics showing cross-sectional views of the bipolar transistor as it progresses through a combination of process steps which comprise one embodiment of the method of the present invention.

Generally, with respect to these drawings, the first digit of a three digit reference number for an element shown on a drawing corresponds with the figure number referenced when the element was first discussed in this specification. In the figures, "N" and "P" refer respectively to negatively and positively doped semiconductor regions, while the associated subscripts "+" and "—" respectively indicate heavy and light doping. As previously stated, the preferred embodiments described in the detailed description of the invention are described in terms of an N-P-N type bipolar transistor.

To make it easier to relate the drawings to the preferred embodiments described herein, the drawings are marked to indicate an N-P-N type transistor. However, one skilled in the art can easily adjust the negative type material and positive type material markings to correspond to a P-N-P type transistor.

DESCRIPTION OF THE PREFERRED EMBODIMENTS

Figure 2A:
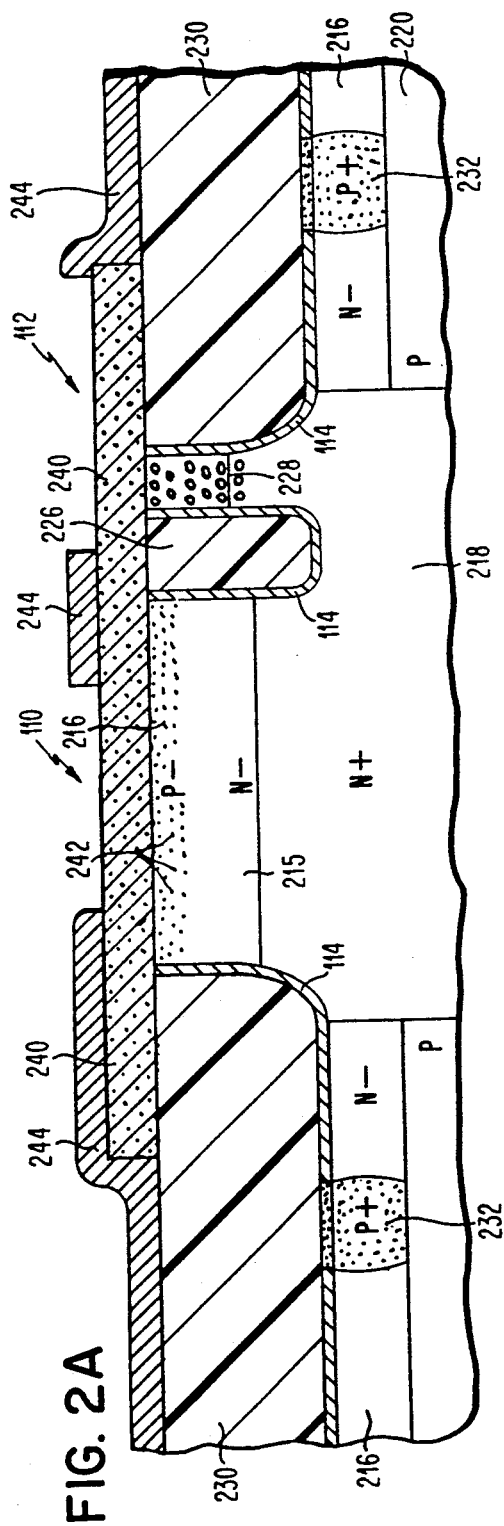
Figure 2B:
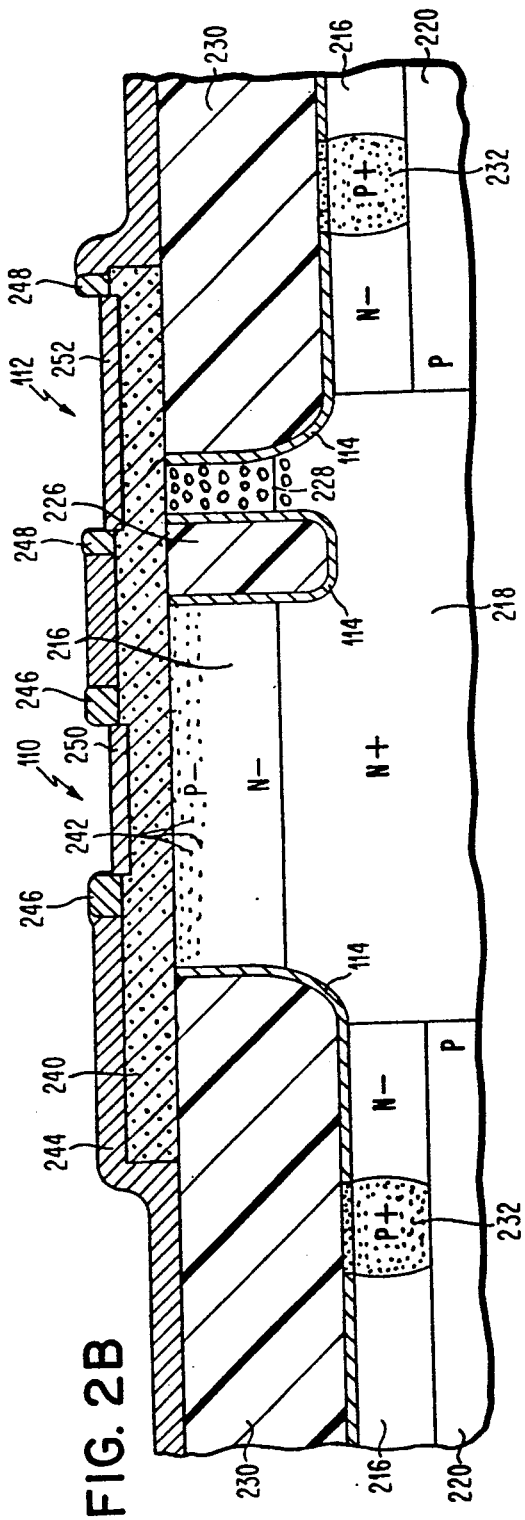
Figure 2E:
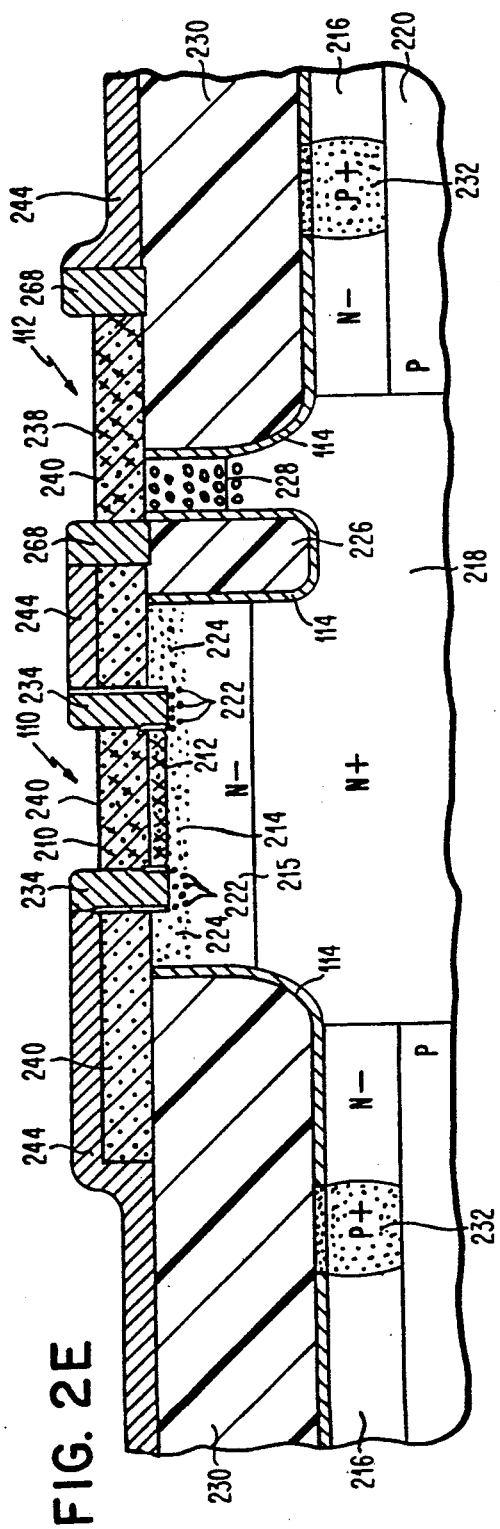
Figure 2F:
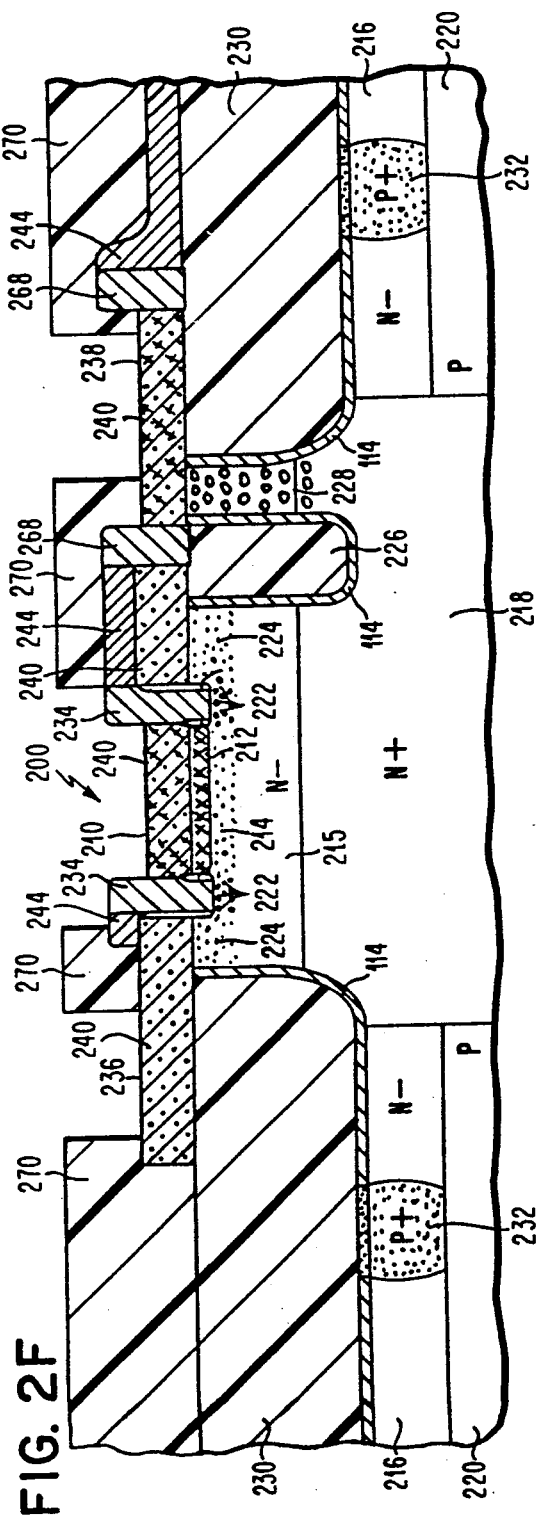

A bipolar transistor 200 in accordance with the present invention is shown in FIG. 2F. Moving from top to bottom along the center of FIG. 2F, bipolar transistor 200 includes an emitter contact 210, an emitter 212, an intrinsic base 214, a collector 215, a subcollector 218, and a substrate 220. Moving laterally to the right of intrinsic base 214, bipolar transistor 200 also includes link base 222, extrinsic base 224, an inner field oxide 226, collector wall 228, an outer field oxide 230, and a channel stop 232 at the base of outer field oxide 230. Moving radially to the left of intrinsic base 214, bipolar transistor 200 includes link base 222, extrinsic base 224, outer field oxide 230, and channel stop 232. Surrounding emitter contact 210 and emitter 212 is isolation trench 234. Remaining surface features include base contact 236, collector contact 238, low temperature oxide layer 244, and surface oxide layer 270.

When bipolar transistor 200 is on, a base current successively transverses base contact 236, conductive layer 240, which forms the direct contact with extrinsic base 224, doped link base 222, and lightly doped intrinsic base 214, where it merges with an emitter current. The emitter current path is generally downward from emitter 212, gradually dispersing toward subcollector 218. The maximum oscillation frequency of the transistor is constrained by the resistance encountered by the base current. The bipolar transistor structure shown in FIG. 2F, including the self-aligned, trench-isolated emitter structure, permits heavy doping of extrinsic base 224 to improve conductivity, and thus oscillation frequency. The heavy doping of extrinsic base 224 does not create peripheral transistor problems between emitter 212 and extrinsic base 224, due to the presence of isolation trench 234. In addition, the transistor structure shown in FIG. 2F permits the use of shallow emitter and base junctions (about 0.15 micrometer or less), since the presence of isolation trench 234 prevents peripheral transistor effects which can occur when there is overlapping of intrinsic and extrinsic base areas (such as that shown in U.S. Pat. No. 4,392,149 to Horng et al.).

The self-aligned, trench-isolated emitter structure of the present invention permits overall size reduction of the transistor device whereby junction area is reduced, with accompanying reduction in parasitic capacitance.

The formation of the emitter structure by the method of the present invention does not require the use of RIE etching at the interface between the emitter contact and the emitter, and does not require RIE etching at the interface between the emitter and the intrinsic base. Thus, the crystalline structure at these interfaces is less damaged by processing steps, resulting in less leakage across the interfaces and a more reliable transistor device.

The fabrication of bipolar transistor 200 begins with a series of steps illustrated in FIGS. 1A-D. Similar initial steps are used in the fabrication of bipolar transistors known in the art. Bipolar transistor 200 is fabricated on P type substrate 220, shown in FIG. 1A, in the form of a silicon wafer. The surface of the substrate is oxidized to form a layer of silicon dioxide, about 6500–7500 Angstroms (A) thick. The oxide is patterned using conventional semiconductor photolithography: A resist is applied over the oxide, the resist is exposed in the desired pattern, the exposed resist is removed to uncover some of the oxide, the uncovered oxide is etched off, and the remaining resist is chemically removed.

A heavy application of arsenic, or other N type dopant such as antimony is then implanted into substrate 220 in areas which are not protected by the oxide layer. Heat is used to drive the arsenic to its ultimate location to define subcollector 218. The heating process used to drive in the arsenic is performed in an oxygen ambient to permit the growth of oxide on the silicon surfaces. Since more silicon is consumed in the area exposed for arsenic implant, upon removal of the oxide layer from all silicon surfaces, a step which can be used to identify the location of subcollector 218 is created. This step can be used for alignment purposes in subsequent process steps. The oxide layer can be removed by techniques such as a dip in hydrofluoric acid. Subcollector 218 is subsequently buried by an epitaxial layer 216 of silicon grown to a thickness of about 1.0 micrometers. This epitaxial layer is lightly doped with N-type dopant to a resistivity of about 0.25 ohm-centimeter. These steps yield the structure of FIG. 1A, in which subcollector 218 is formed as a heavily doped N+ buried layer between the P-type substrate 220 and lightly doped N-type epxitaxial layer 216.

FIG. 1B shows the result of steps used to form apertures 102 and 104, in which outer field oxide 230 and inner field oxide 226 are subsequently formed, respectively. A stress relief oxide layer 106, about 200–400 Angstroms thick is grown on epitaxial layer 216. Silicon nitride 108 is deposited over stress relief oxide layer 106 by low pressure chemical vapor deposition (LPCVD). The stress relief oxide layer 106 serves as a mechanical buffer between silicon nitride layer 106 and epitaxial layer 216, which have different thermal expansion coefficients. Apertures 102 and 104 are defined photo-lithographically, and a fluorine-based dry etch imposes the pattern through the silicon nitride layer 108, stress relief oxide layer 106, epitaxial layer 216, and a portion of subcollector 218. Upon formation of apertures 102 and 104, silicon nitride layer 108 and stress relief oxide layer 106 remain over a base/emitter region 110 and a collector wall region 112 of bipolar transistor 200.

The structure of FIG. 1B is then heated in oxygen to form a silicon dioxide coating 114 everywhere there is silicon; no oxide forms over silicon nitride 108, as is shown in FIG. 1B. Boron is then implanted in area 116, and can be driven in to form channel stop 232 at this time or during the next oxidation step. Channel stop 232 is shown in FIG. 1C.

FIG. 1C shows inner field oxide 226 and outer field oxide 230 in place. During the heating step used to drive in boron implant 116 to form channel stop 232, a layer of oxide is grown over all surfaces except those covered by silicon nitride 108. Typically, oxide layer is a steam grown oxide layer about 7,000 to about 9,000 Angstroms thick; it is this oxide layer which becomes inner field oxide 226 and outer field oxide 230.

To create collector wall 228, two alternative techniques can be used. After the field oxide layer is grown, the intended area over collector wall 228 can be patterned using photoresist techniques and opened to permit removal of silicon nitride layer 108 in that area via a fluorine-based dry etch, with subsequent implantation of phosphorus through oxide 106. Alternatively, in the preferred method, all silicon nitride 108 on the surface of the semiconductor structure can be wet etched off using hot phosphoric acid. This wet etch is followed by photoresist patterning and opening over the intended area of collector wall 228, with subsequent implantation of phosphorus through oxide 106 to define collector wall 228.

After creation of the subcollector wall, the structure is dipped in hydrofluoric acid to remove remaining stress relief oxide 106 which is only about 200 to 400 Angstroms thick. FIG. 1D shows silicon nitride layer 108 and silicon dioxide layer 106 removed over base/emitter region 110 and collector wall 228. The steps represented in FIGS. 1A–D are believed to correspond closely with steps used to fabricate bipolar transistors in general. However, additional information recently obtained through laboratory work has been included to bring the method steps disclosed to the best mode disclosure level. The process steps which follow, and the structure formed thereby are unique to this invention.

FIG. 2A shows a layer 240 of polycrystalline silicon (polysilicon) about 2500 Angstroms thick which is blanket deposited over the semiconductor surface using low pressure chemical vapor deposition (LPCVD). The polysilicon is next patterned using photolithography, wherein a protective mask is created over base/emitter region 110 and collector wall region 112. Subsequently, the polysilicon is etched away from all deposition areas except over base/emitter region 110 and collector wall region 112, which were mask-protected. This single layer 240 of polysilicon will provide the contacts (shown in FIG. 2F) to the bipolar transistor emitter 212, in the form of emitter contact 210; to extrinsic base 224, in the form of base contact 236; and to collector 215 through collector wall 228, via collector contact 238.

After deposition of polysilicon layer 240, or an equivalent conductor such as amorphous silicon, upon the semiconductor structure surface, boron or boron difluoride 242 is implanted into polysilicon layer 240 and then diffused into the upper portion of epitaxial layer 216. It would be possible to provide the lightly doped P− area 214 shown in FIG. 2F by depositing an epitaxial layer of material comprising a P− type dopant, or to dope the upper portion of epitaxial layer 216 prior to application of conductive polysilicon layer 240. However, by diffusing boron 242 through polysilicon layer 240 to dope the upper portion of epitaxial layer 216, better control of the depth of doping in epitaxial layer 216 is obtained. Control of this doping step is very important, since this permits formation of shallow base junctions of the kind described herein. The wafer structure can be annealed after implantation of boron 242 into polysilicon layer 240 to drive the boron into the epitaxial layer of silicon 216, as is shown on FIG. 2A to provide a lightly doped P− area, or the annealing can be done simultaneously with another step requiring heating later during the process.

An oxide film 244 about 3000 Angstroms thick is next applied using a low temperature oxide deposition. This oxide film is blanket deposited over the entire upper surface of the wafer. Subsequently emitter region 110 and collector region 112 are patterned upon the surface of oxide 244 using known photolithography techniques. The oxide surface exposed upon patterning of the photoresist is then etched using commonly known reactive ion etching (RIE) techniques or wet etching techniques which remove oxide 244 from the surface of polysilicon layer 240 in the area of the emitter and collector regions, as indicated in FIG. 2A. FIG. 2B illustrates the next step in the process, wherein silicon nitride is applied atop emitter contact area 110 and collector contact area 112 which were opened through oxide layer 244. The silicon nitride is applied to a thickness of about 2500 Angstroms using LPCVD. A center spacer area is then etched out from each silicon nitride deposited area, down to the surface of polysilicon layer 240, using anisotropic trifluoromethane RIE, thereby creating silicon nitride spacer walls 246 in the emitter contact area and 248 in the collector contact area. With the silicon nitride sidewall spacers 246 and 248 in place, and the polysilicon surface in the emitter and collector contact areas are exposed, a localized oxidation of the polysilicon surface within the emitter and collector contact areas is obtained via steam oxidation, to form oxide layer 250 inside emitter sidewall spacer 246 and oxide layer 252 inside collector sidewall spacer 248, as shown at FIG. 2B. FIG. 2C shows the next step in which silicon nitride spacer walls 246 and 248 are removed using a phosphoric acid dip. Although a portion (about one third) of oxide layers 250 and 252 are also removed during the phosphoric acid dip, the remaining portion of oxide layers 250 and 252 are more than adequate for protection of the underlaying polysilicon layer 240 during RIE etching of isolation trench 254 around the emitter contact area and isolation trench 256 around the collector contact area. Isolation trenches 254 and 256 are etched through polysilicon layer 240 and into the upper portion of epitaxial silicon layer 216 using a combination of boron trichloride and chlorine.

The emitter isolation trench 254 can be etched so that it extends through polysilicon layer 240 but does not extend significantly into epitaxial silicon layer 216. This avoids the possibility of RIE damage to epitaxial layer 216. However, this is not the preferred embodiment of this invention, because the isolation trench then does not prevent expansion of emitter dopant (introduced into the upper portion of epitaxial layer 216 interior to the trench location in later steps) into epilayer 216 areas exterior to the trench, which exterior areas function as the extrinsic base for the transistor structure. In the preferred embodiment, isolation trench 254 extends into epilayer 216 to a depth slightly less than the depth of boron dopant 242. Extended isolation trench 254 prevents expansion of the arsenic emitter dopant introduced into the area surrounded by isolation trench 254 in later steps, and reduces peripheral transistor effects in the final transistor structure.

The collector contact isolation trench 256, etched simultaneously with emitter isolation trench 254, serves to isolate the portion of polysilicon layer 240 which is to function as the collector contact from the portion of polysilicon layer 240 which lies between trench 254 and trench 256. Isolation trenches 254 and 256 are etched in a single process step as part of a simplified process, since it would be more expensive to open the collector contact area separately in subsequent process steps. Collector contact isolation trench 256 is formed over field oxide areas 226 and 230 and is subsequently filled with an oxide, so the depth of trench 256 is not critical so long as trench 256 extends completely through polysilicon layer 240.

FIG. 2D illustrates the formation of oxide layers 258 and 260 on the walls of emitter isolation trench 254 and collector trench 256 where silicon is exposed, using steam oxidation techniques of the kind known in the art.

At this time in the process, it is preferred (but not necessary) to place boron at the base of emitter isolation trench 254 into episilicon layer 216, to form link base 222 as shown in FIG. 2F. This boron placement can be achieved by at least two methods which are described hereafter as method A and method B. In method A, the link base 222 boron is placed into episilicon layer 216 at the base of isolation trench 254 using difluoroboron ion implantation. When ion implantation is used, it is not necessary to remove the portion of oxide layer 258 which has formed at the bottom of trench 254. In method B, anisotropic RIE using trifluoromethane removes portion of oxide layer 258 which has formed at the base of trench 254 over episilicon layer 216, leaving episilicon layer 216 exposed in this area. This permits gas-phase doping using diborane to form a boron-doped link base 222. Use of gas-phase boron doping, rather than ion implantation of boron, to form link base 222 is preferred, because it is difficult to control a zero degree shallow boron implantation. Gas-phase boron doping to form link base 222 permits formation of a very shallow link base 222 which does not extend through the shallow collector 215 portion of epilayer 216. Typically the cross-sectional thickness of link base 222 as shown in FIGS. 2D–2F ranges from about 400 Angstroms to about 800 Angstroms and the thickness of collector layer 215 ranges from about 2000 Angstroms to about 4000 Angstroms.

An isolation oxide 264 is now used to fill trenches 254 and 256 and overlaying adjacent areas. Oxide 264 is deposited using a combination of ozone and tetraethoxysilane in commercially available equipment, using a technique known in the art.

FIG. 2E illustrates the formation of emitter 212 within the area surrounded by emitter isolation walls 234. First oxide layers 264/250 and 264/252 are removed from emitter contact area 110 and collector contact area 112, respectively, down to polysilicon layer 240 by anisotropic etching with trifluoromethane RIE. This leaves an isolation wall of oxide 234 surrounding polysilicon layer 240 in emitter area 210 and extending down into underlaying episilicon layer 216. A wall of oxide 268 also remains, surrounding polysilicon layer 240 in collector contact area 112. The emitter isolation wall 234 extends through episilicon layer 216 to link base 222, and isolates emitter 212 (to be formed in subsequent steps) and a large portion of intrinsic base 214 from extrinsic base area 224. This extension of isolation trench 234 into epilayer 216 prevents peripheral transistor effects between emitter 212 and extrinsic base 224, providing a better functioning intrinsic transistor device.

The arsenic dopant necessary to create N+ emitter 214, emitter contact 210 and collector contact 238 is now implanted in polysilicon layer 240 over these areas via ion implantation using techniques known in the art. The arsenic dopant is diffused down into epitaxial silicon layer 216 beneath emitter contact 210 to form emitter 214 using a high temperature annealing process such as Rapid Thermal Anneal (RTA).

FIG. 2F shows the completed bipolar transistor. In a preferred embodiment of the present invention, a photoresist is patterned over the surface of the structure shown in FIG. 2E in a pattern wherein photoresist remains covering emitter contact 210, isolation wall 234, portions of oxide layer 244 immediately adjacent to isolation wall 234, and the area over collector contact area 112. The patterned photoresist leaves exposed the portion of polysilicon layer 240 in the areas overlaying extrinsic base 224. Oxide layer 244 is then etched from the transistor structure surface over the exposed area. Additional boron dopant is then introduced through conductive layer 240 into extrinsic base 224. Introduction of this additional dopant is not necessary for the transistor to function, but provides improved conductivity in the extrinsic base 224, improving the device performance.

Another optional process step is available at this time. After implantation of additional boron into extrinsic base 224, the photoresist mask is removed; at this time conductive layer 240 surfaces in contact areas, ie. base contact layer 240 above extrinsic base 224, emitter contact layer 240 over emitter 212, and collector contact layer 240 over collector wall 228, are exposed. A conductive silicide layer can be formed over these layer 240 conductive surfaces if desired. For example, a layer of titanium, platinum or equivalent metal is applied over conductive layer 240 areas exposed, and the structure is annealed to produce titanium or platinum silicide. Residual titanium or equivalent metal in contact with other structure surface areas in removed by a wet chemical etch. A silicide layer is not shown in FIG. 2F.

To prepare the transistor structure for metallization, an additional layer of oxide 270 is applied over the transistor structure surface. Subsequently extrinsic base contact 236, emitter contact 210, and collector contact 238 are opened through oxide layer 270.

The structure and method described above can be improved in terms of manufacturing repeatability by using additional layers of polysilicon and silicon nitride during formation of the transistor emitter. The emitter, shown as 212 in FIG. 2F, is formed by implanting arsenic into overlaying polysilicon layer 240 and subsequently driving the arsenic from layer 240 into underlaying episilicon layer 216. The thickness of polysilicon layer 240 affects the amount and depth of diffusion of the arsenic dopant from that layer into underlaying epilayer 216. When the oxide layer 244 overlaying polysilicon layer 240 is etched, as described above, there is always the possibility polysilicon layer 240 will be overetched, or that the etch may not be uniform. When this happens, the amount of arsenic driven into epilayer 216 can vary, and depth of diffusion of arsenic can change so that the shallowness of the emitter layer can vary from device to device. Thus, the emitter/base profile can change sightly from device to device. Use of techniques to more carefully control the thickness of the polysilicon layer from which the arsenic is transferred into the underlaying device emitter results in manufacturing of a more consistent device. Additionally, the formation of oxide layer 250 over polysilicon layer 240 (shown in FIG. 2B) can result in a substantial removal of boron 242 from polysilicon 240, due to the preferential segregation of boron to a thermal oxide during growth. Such boron loss can effect the reproducibility of the profile formed in the preferred embodiment, in which boron 242 is introduced into polysilicon 240 prior to diffusion into the upper portion of epitaxial layer 216.

Figure 3:
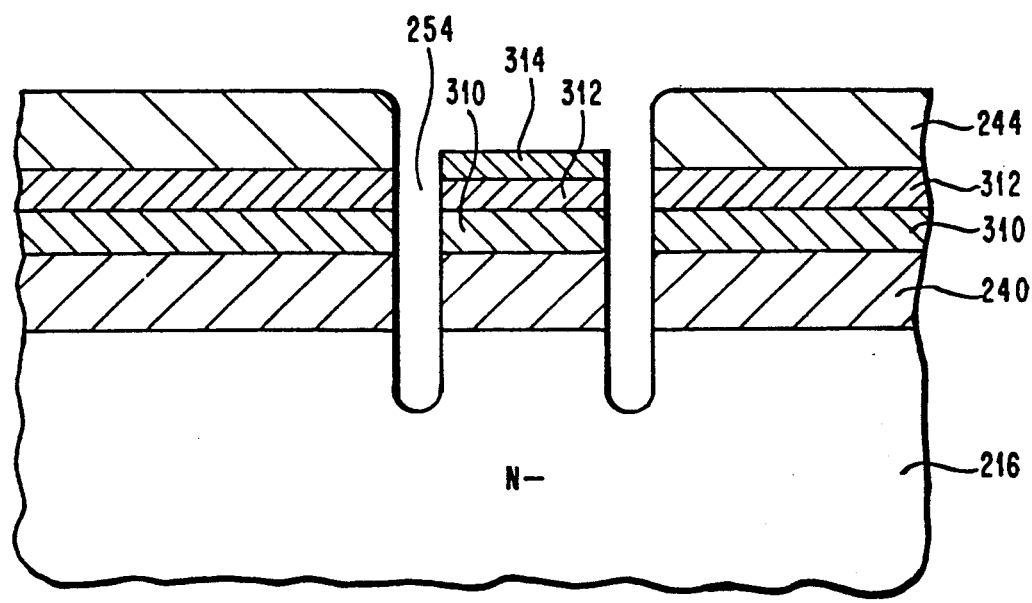
FIG. 3 is a schematic of an alternative structure which can be generated during the self-aligned, trench-isolated emitter formation process, to improve manufacturing repeatability of the emitter/base profile of the transistor device.

FIG. 3 shows schematic of an alternative structure which can be generated in the self-aligned, trench-isolated emitter formation process, to improve the emitter/base profile repeatability. The steps used to form this alternative structure very closely parallel the steps previously described and thus are only briefly described at this time. A first layer of polysilicon 240 about 2500 Angstroms thick is deposited on the semiconductor structure in an intended emitter region, as previously described. A first layer of silicon nitride 310 about 300 Angstroms thick is subsequently applied over the surface of first polysilicon layer 240. A second layer of polysilicon 312 about 650 Angstroms thick is deposited overlaying silicon nitride layer 310. A layer of oxide 244 about 3000 Angstroms thick is applied over the surface of second polysilicon layer 312. The emitter is patterned using photolithographic techniques as previously described, and oxide 244 is etched over the emitter area down to the surface of second polysilicon layer 312. A second layer of silicon nitride (not shown in FIG. 3) about 2500 Angstroms thick is then applied over the etched oxide area. The second layer of silicon nitride is etched to form a nitride spacer (not shown in FIG. 3), as previously described herein, leaving the surface of second polysilicon layer 312 surrounded by the nitride spacer exposed. An oxide etch-masking layer 314 about 800 Angstroms thick is formed by thermal oxidation on the exposed surface of second polysilicon layer 312. The nitride spacer is then stripped to provide a suitable structure for etching. An isolation trench 254 is now etched at the location of from which the nitride spacer was stripped. Isolation trench 254 is etched through second polysilicon layer 312, first silicon nitride layer 310, first polysilicon layer 240, and preferably into the episilicon layer 216 underlaying first polysilicon layer 240. The oxide etch-masking layer 314, and second polysilicon layer 312 are removed in subsequent process steps, leaving first nitride layer 310 overlaying first polysilicon layer 240. After implantation of arsenic dopant into first polysilicon layer 240 and high temperature annealing to form the emitter, first nitride layer 310 is removed by dipping in a wet etchant or by dry etching. This sequence provides a polysilicon layer for arsenic implantation and emitter drive-in, the thickness of which is affected only by the accuracy in deposition of the polysilicon layer itself, and thus a more consistent emitter can be produced.

In addition, the presence of nitride layer 310 acts as a barrier to the diffusion of boron from underlaying layers such as polysilicon layer 240, so that segregation of boron 242 to oxide layer 314 during the growth of oxide layer 314 is prevented. The boron 242 concentration in polysilicon layer 240 is thus determined solely by the thickness of polysilicon layer 240 and by the accuracy of the boron implantation dose, so that a more consistent base can be produced.

In the background of the invention it was pointed out that the present invention enables the use of a single layer of polysilicon to form both the emitter and base contacts in a transistor structure which has particularly shallow emitter and base junctions (0.15 micrometer or less). In addition, the use of an isolation wall between the emitter and the heavily doped extrinsic base and between the emitter and the lightly doped intrinsic base exterior to the isolation wall reduces parasitic effects between transistor elements. The following EXAMPLES illustrate preferred embodiments in which the ability of the present invention process steps to form such shallow emitter and base junctions, the isolation wall, and the polysilicon contacts using a single polysilicon layer is demonstrated.

EXAMPLE 1

With reference to FIG. 2A, the opening to the emitter area 110 which was etched through oxide layer 244 and into the upper portion of polysilicon layer 240 was approximately 0.8 micrometers in width. A layer of silicon nitride was deposited over the etched opening, as described above. The silicon nitride was the RIE etched using a combination of trifluoromethane and oxygen to form silicon nitride spacer walls 246 (as shown at FIG. 2B) approximately 0.3 micrometer in height and about 0.2 micrometer in thickness. The exposed polysilicon surrounded by silicon nitride spacer walls 246 was then steam oxidized to produce an oxide layer 250 about 800 Angstroms in thickness.

EXAMPLE 2

With reference to FIG. 2C, silicon nitride spacer walls 246 were removed using hot phosphoric acid. Then isolation trench 254 was formed by RIE etch in the manner previously described. Trench 254 was determined to be about 0.2 micrometers wide and to extend into episilicon layer 216 to a depth of about 0.05 micrometers.

EXAMPLE 3

With reference to FIGS. 2C and 2D, an isolation trench 254 approximately 0.2 micrometers wide had been etched in the manner described previously, extending through oxide layer 244, polysilicon layer 240, and into episilicon layer 216 to a depth of about 500 Angstroms. An inner wall of steam oxide about 200 A thick (shown as 258 at FIG. 2D) was grown on the inside of trench 254, and the oxide was RIE etched off the bottom of the trench, exposing episilicon layer 216 at the bottom of isolation trench 254. Gas-phase doping with diborane was then carried out to provide a boron-doped link base 222 at the bottom of trench 254 in the manner previously described. The thickness of link base 222 was about 800 Angstroms. During the vapor phase doping of link base 222, the process temperature used (about 850 degrees C) promotes diffusion of ion implanted boron 242 (shown in FIG. 2A) from polysilicon layer 240 into episilicon layer 216 to form lightly doped intrinsic base 214 and extrinsic base 224. Isolation trench 254 was then refilled with an insulating oxide 264 using the method previously described with reference to FIG. 2D. The width of trench refill oxide 264 within the trench was about 0.2 micrometers, and the thickness of trench refill oxide layer 264 overlaying oxide 250 was determined to be about 0.3 micrometers.

The preferred embodiments disclosed and the particular process steps described do not provide all of the possible structures and process methods which can be used to practice the present invention. To attempt to provide all structures and methods would render this disclosure too complex and obscure the critical elements of the structure and method which comprise the present invention. It is believed that with the disclosure provided herein one skilled in the art can form a bipolar transistor having a self-aligned, trench-isolated emitter, wherein the conductive contacts for the transistor emitter, base, and surface collector are formed from one layer of polysilicon, whereby particularly shallow emitter and base junctions can be utilized without parasitic problems of the kind previously encountered in the prior art. It is possible to vary the materials used to form the elements of the bipolar transistor and to vary the sequencing of the steps used to form the structure of the present invention and still fall within the spirit and scope of the present invention. Such variations are provided for by the present invention, the scope of which is defined only by the following claims.

What is claimed is:

1. A bipolar transistor comprising:
   a substrate;
   a horizontally extending epitaxial layer formed on and above said substrate, said epitaxial layer having a lower surface contacting said substrate and an upper surface facing away from said substrate, said upper surface defining an upper epitaxial surface level, said epitaxial layer having a collector and an upper active region, said collector extending from said lower surface part way through said epitaxial layer, said upper active region extending from said collector to said upper surface, said upper active region including an emitter, an intrinsic base, an extrinsic base, and a link base,
   said emitter extending downwardly toward said collector from said upper surface,
   said intrinsic base being located between said emitter and said collector,
   said extrinsic base extending downwardly from said upper surface to said collector, said extrinsic base being spaced from said emitter,
   said link base electrically and physically coupling said extrinsic base with said intrinsic base, said link base being spaced below said upper epitaxial surface level;
   a polysilicon emitter contact formed on said upper surface, said emitter contact being in physical and electrical contact with said emitter;
   a polysilicon base contact formed on said upper epitaxial surface, said base contact being in physical and electrical contact with said extrinsic base, said base contact being spaced from and coplanar with said emitter contact; and
   a dielectric wall extending upwardly from said link base through said upper epitaxial surface level and to a level above said emitter contact so as to electrically isolate said emitter from said extrinsic base and said emitter contact from said base contact;
   whereby, current is prevented by said dielectric wall from flowing horizontally so that vertical current flow is enhanced, maximizing transistor gain and frequency bandwidth.

2. A bipolar transistor comprising:
   a substrate defining a vertical direction orthogonal thereto;
   a horizontally extending epitaxial layer formed on said substrate, said epitaxial layer having a lower epitaxial surface in contact with said substrate and an upper epitaxial surface facing away from said substrate, said upper surface defining an upper epitaxial surface level, said epitaxial layer having a collector and an upper active region, said collector extending from said lower epitaxial surface part way through said epitaxial layer, said upper active region extending from said collector to said upper surface, said upper active region including an emitter, an intrinsic base, an extrinsic base, and a link base,
   said emitter extending downwardly toward said collector from said upper epitaxial surface, said emitter defining an emitter space which is the vertical projection space of said emitter,
   said intrinsic base located between said emitter and said collector, said extrinsic base extending downwardly from said upper epitaxial surface to said collector, said extrinsic base defining an extrinsic-base space which is the vertical projection of said base contact, said extrinsic-base space excluding said emitter and said intrinsic base, said link base electrically and physically coupling said extrinsic base with said intrinsic base, said link base being located at a level below said emitter;

a polysilicon emitter contact formed on said upper epitaxial surface, said emitter contact being in physical and electrical contact with said emitter, said emitter contact being excluded by said extrinsic-base space;

a polysilicon base contact formed on said upper epitaxial surface, said base contact being in physical and electrical contact with said extrinsic base, said base contact being excluded by said emitter space, said base contact being coplanar with said emitter contact; and a dielectric wall extending upwardly from said link base through said upper epitaxial surface level and to a level above said emitter contact so as to electrically isolate said emitter from said extrinsic base and said emitter contact from said base contact.

* * * * *